United States Patent [19]

Doemens

[11] 4,253,112
[45] Feb. 24, 1981

[54] PROCESS FOR AUTOMATIC ALIGNMENT OF TWO OBJECTS TO BE ADJUSTED WITH RESPECT TO ONE ANOTHER

[75] Inventor: Guenter Doemens, Holzkirchen, Fed. Rep. of Germany

[73] Assignee: Siemens Aktiengesellschaft, Berlin & Munich, Fed. Rep. of Germany

[21] Appl. No.: 40,540

[22] Filed: May 21, 1979

[30] Foreign Application Priority Data

May 22, 1978 [DE] Fed. Rep. of Germany ....... 2822269
Oct. 24, 1978 [DE] Fed. Rep. of Germany ....... 2846316

[51] Int. Cl.³ .............................................. H04N 7/18
[52] U.S. Cl. ................................... 358/101; 358/903; 364/515
[58] Field of Search ................... 358/101, 93, 903; 364/515

[56] References Cited

U.S. PATENT DOCUMENTS 3,712,740 1/1973 Hennings ............................ 356/393
3,988,535 10/1976 Hickman ............................ 358/101

FOREIGN PATENT DOCUMENTS 1919991 11/1973 Fed. Rep. of Germany .

Primary Examiner—Howard W. Britton
Attorney, Agent, or Firm—Hill, Van Santen, Steadman, Chiara & Simpson

[57] ABSTRACT

Mask adjustment is automated in order to be able to adjust edges having extremely low contrast on silicon disks (wafer) with the highest precision possible with respect to edges on the mask. Different straight lines which extend orthogonally with respect to one another on the disk and the mask are integrated line-wise by line-wise opto-electronic scanning of the intensity of brightness on a parallel basis. The values obtained are stored and the difference in values of successive lines is formed and centroids are formed from the resultant course, which are further combined into a mean value which is to be assigned to the position of the center line of a stroke on the disk or, respectively, mask. The process is likewise carried out for both directions (x,y) on the basis of the corresponding adjustment structures on the mask and the disk.

32 Claims, 21 Drawing Figures

| Δy 11 Δx 11 | Δy 12 Δx 12 | Δy 13 Δx 13 |
|---|---|---|
| Δy 21 Δx 21 | Δy 22 Δx 22 | Δy 23 Δx 23 |
| Δy 31 Δx 31 | Δy 32 Δx 32 | Δy 33 Δx 33 |

| 0,5 | 0,8 | 0,5 |
|---|---|---|
| 0,8 | 1 | 0,8 |
| 0,5 | 0,8 | 0,5 |

PROCESS FOR AUTOMATIC ALIGNMENT OF TWO OBJECTS TO BE ADJUSTED WITH RESPECT TO ONE ANOTHER

BACKGROUND OF THE INVENTION

1. Field of the Invention

The present invention relates to a process for automatic alignment of two objects which are to be adjusted with respect to one another, particularly for the automation of mask adjustment in oreder to be able to precisely position the structure of the mask with respect to the structure on a disk in a disk illumination in semiconductor fabrication.

2. Description of the Prior Art

In semiconductor technology, and in many other applications, for example in the manufacture of structured plates for scales, one is confronted with the task of aligning two structured plates with respect to one another with high precision. For example, it is a matter of two substrate plates of which at least one is transparent and of which both bear a pattern on one surface. In semiconductor technology, in general, in which a semiconductor disk already carries a first pattern on its surface and is coated on that surface with a light-sensitive lacquer, a second pattern contained in a mask must be translated into a position which is precisely adjusted with respect to the first pattern.

The translation can be carried out by means of contact illumination, gap illumination or projection illumination. In gap illumination, which at present has the greatest significance attached thereto, a gap of about 20 μm exists between the mask and the disk in order to avoid mask damage. This renders the visual adjustment of mask structures with respect to disk structures more difficult since only one structure can be sharply imaged or, respectively, the sharpness plane lies between the two structures.

Normally, special adjustment marks are employed for the mutual alignment of the mask to the disk through the utilization of two adjustment microscopes which are arranged at a fixed distance.

In the German Pat. No. 1,919,991, an arrangement is illustrated and described in which the automatic alignment of two plates having structures is possible with only three or even only two measuring systems.

SUMMARY OF THE INVENTION

The object of the present invention is to adjust the structures on the mask to the structures on the disk in a fully automatic manner, with high precision, and in a short time, with minimum optic contrast and unclear imaging of the structures. Moreover, the process should be realized with the smallest possible expense of apparatus and the adjustment result should be largely unfluenced by fluctuations of the optical properties of the structures as well as disruptions in their extent.

The foregoing object is achieved in that the intensity of the brightness values in the area or sub-area of the adjustment structures is integrated line-wise or line section-wise on the basis of various straight lines which extend orthogonally to one another on the disk and mask by means of line-wise opto-electronic scanning (for example, by means of a TV camera, laser scanner) respectively proceeding parallel thereto. The values resulting from the opto-electronic scanning are stored and the difference from the results of successive lines is formed. Also, centroids (centers of areas) which have arisen because of the brightness change are formed in the areas from the resulting curve. The positions of the various centroids thus obtained are further combined to a mean value which is to be assigned to the position of the center line of a line on the disc or, respectively, mask. The process is executed for both directions (x, y) on the basis of the corresponding adjustment structures on the mask and on the disk.

By means of integration, one can govern very low contrasts which even lie below the noise amplitude of an image sensor. By means of line-wise subtraction, one becomes largely independent of illumination and receiver inhomogeneities. The centroid formation makes the results likewise largely independent of fluctuations of the illumination intensity and of the reflective properties of the surface. In place of centroid formation, the comprehension of the maximum values from the differential signal can be employed. By employing a mean value formation from various pitch lines or, respectively, the position of the various maximums, one is able to obtain a greater precision than is provided by means of a systematic resolution of the line interval. By means of the great integration length, disruptions such as indentations in edges or isolated points are suppressed, insofar as their size is small in relationship to the integration length or their edge orientations noticeably deviate from the line directions, which is generally true.

According to a further development of the invention, the process occurs in at least two steps, in particular, a rough adjustment and a fine adjustment, whereby for the rough adjustment line-integration in the marginal area in the field of vision is performed for detecting the lines on the disk, and the disk or, respectively, the mask, is then moved and for the fine adjustment the position of the adjustment lines, which are then in close proximity, of the mask to the disk is determined with respect to one another in a different integration area, for example, in the center.

By means of an adjustment in two or more steps, it is achieved, even given a large initial capture area, that the adjustment marks of the mask and the disc lie very close to one another at the last adjustment step, and, therefore, recording errors which could either result from the optics or from the image sensor are barely noticeable in the measuring result.

According to a further development of the invention, in order to attain high precision in the fine adjustment, the adjustment lines of the disc lie between those of the mask or, respectively, vice versa, for example, disk like/mask line/disk line or vice versa, so that an observation of symmetry can be carried out. The advantage of the observation of symmetry is that the adjustment need not be carried out with absolute values, so that possible insignificant calibration erros of the system are also primarily unnoticeable in the adjustment result.

For a complete exploitation of the efficiency of especially accurate structure transfer processes for smaller structures, such as for example, projection illumination and x-ray lithography, the visual adjustment precision is often no longer sufficient. Therefore, in a further development of the invention, a fully automatic adjustment sequence is to be assured by means of invention, whose precision corresponds to the requirements, for example, of the processes just set forth above.

The solution to this problem is provided in that, by means of multiple arrangements of the combination disk line/mask line/disk line or, vice versa, the symmetrical observation of the preceding evaluation is respectively executed and the individual results are combined in a final result. Thereby, in the solution according to the present invention, the precision is increased corresponding to the laws of statistics and increases with the number of individual elements. Moreover, by utilizing a multiple arrangement, the influence of changing edge developments, particularly of the disk, is largely eliminated from the adjustment precision.

In order to increase certainty, the centroids employed for the evaluation, according to the present invention, are monitored with regard to their number, form and distribution.

According to a further development of the invention, for the position recognition in the rough adjustment, the integration is preferably carried out in the outer areas of the field of vision of an image sensor working line-wise, whereas the adjustment structure for the fine adjustment lies outside of this area, preferably in the center of the field of vision. A clear possibility for distinguishing between lines on the mask and lines on the disk arises in this manner. Furthermore, it is thereby assured that the fine adjustment is undertaken in the area of the optical axis.

According to a further development of the invention, the line-wise integration of the brightness values is carried out on an analog basis by way of operational amplifiers, and further, the differential formation of the successive integrals is likewise realized on an analog basis and then the voltage values existing per line are converted into digital form and stored in an arithmetic unit, preferably a microprocessor. The centroid determination, the combination of a plurality of pitch lines to center lines and the monitoring of the individual surfaces with regard to number, form and distribution is carried out in the microprocessor and the adjustment magnitudes for the adjustment process are determined therefrom and output for utilization. No information loss of the image content arises because of the analog image preprocessing (integration and subtraction). Moreover, this processing occurs in real time and contributes significantly thereto that the entire image evaluation can be carried out in a relatively short time.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENTS

Low contrast edges can still be thoroughly well perceived visually, although they lie below the noise amplitude in the compander action of the signal of an image sensor, for example, a television camera. An electronic recognition is thereby rendered extremely difficult.

Referring to FIGS. 1a-1c, illustrations are provided as to how this disadvantage can be corrected for straight-line edges having approximately known angular orientation. To that end, an image sensor, (for example a television camera, laser scanner, semiconductor image sensor) working line-wise is oriented in its line direction approximately parallel to the edge to be scanned and the video signal is integrated over a certain section 1.

In FIG. 1a, a low contrast edge 1, the position of lines n, n+1 and the integration lengths l are illustrated. The voltage curve within the lines n and n+1 can be seen from FIG. 1b, whereby the line n lies before the investigated edge and the line n+1 lies in the investigated edge. The compander action or contrast rise is lower here than the noise amplitude and, therefore, the edge is not directly electronically detectable. FIG. 1c illustrates the result of an integration over the length l for the line n and n+1. This integration produces a clear, repeatable voltage difference ΔU which is sufficient for the secure electronic edge recognition.

FIGS. 2a-2g illustrate the basic procedure for recognition and position determination of the lines on a mask (for example, chromium structure) or, respectively, the disk (for example, oxide structure). This demonstration is provided on the basis of a line 2 on a disk 3 which is formed by means of an oxide layer 4 and is covered with a photoresist 5. Optically, because of their acclivities, lines of this type generally appear at the edges which do not reflect parallel incident light back into the imaging lens. In this case, two dark, low contrast lines 6 (FIG. 2b) derive from the limitation for the line 2. The scanning direction is indicated at the left of this presentation. The scanning line extends parallel to the investigated line 2 or, respectively, 6. The distance between two lines is designated with Δ and the length for the analog integration is designated l.

FIG. 2c illustrates the result of the analog integration. The low contrast lines 6 appear only as weak indentations in the signal. The asymmetrical total distribution is meant to represent an illumination which is not completely homogeneous or, respectively, a receiver inhomogeniety. In this processing step, the continuous television lines have the continuous numbers 1, 2, 3, etc.

FIG. 2d illustrates the line-wise difference of the values illustrated in FIG. 2c.

In order to improve the signal in FIG. 2d, the difference between lines having a specific interval can be formed, for example, line 1 minus line 3, line 2 minus line 4, etc, instead of the difference of neighboring lines. It is further expedient to undertake a smoothing of the course of the curve with circuit means at this location for reasons of time. In this process step (differential signal), the television lines have the continuous numbers 1', 2', 3', etc. One manner of accomplishing this purpose may comprise, for example, gathering the differential signal over several lines and joining the same to one another, as is indicated, for example, by means of the operation 1'+2'+3'; 2'+3'+4', etc.

As the next step, the analog image signal which exists in this form and is precompressed is digitized line-wise and stored in an arithmetic unit, for example, in a microprocessor.

As illustrated in FIG. 2e, the signal is severed in the area of the zero line by means of a symmetrical threshold. By doing so, an isolated surface F which represents the change of brightness intervals in the respective areas arises for each bright and dark transition.

The centroids of the individual lines are now determined in the arithmetic unit for determining the position of the line 2. In comparison to a fixed evaluation threshold, the centroid formation has the advantage that the results are independent of the magnitude of the contrast and the sharpness. Further, the position determination is not influenced, or only insignificantly influenced, by strokes within a line which are defined with unequal strength.

The results of the surface profile line determination are illustrated in FIG. 2f. In this case, it is a matter of four line numbers, in particular the lines S1–S4. Further mean value formations follows from these values. First of all, the mean value between S1 and S2 or, respectively, S3 and S4 is formed (FIG. 2g) and the center line is again calculated therefrom (FIG. 2g) which represents the physical access Ss of the investigated line 2.

Accuracies which are far greater than the systematic resolution prescribed by the line interval are achieved by means of the area determination, as well as by means of the repeated mean value formation.

An amplification of this effect can be achieved in that one forms the adjustment lines in such a manner that no more than two dark strokes arise per line.

Figure 2:
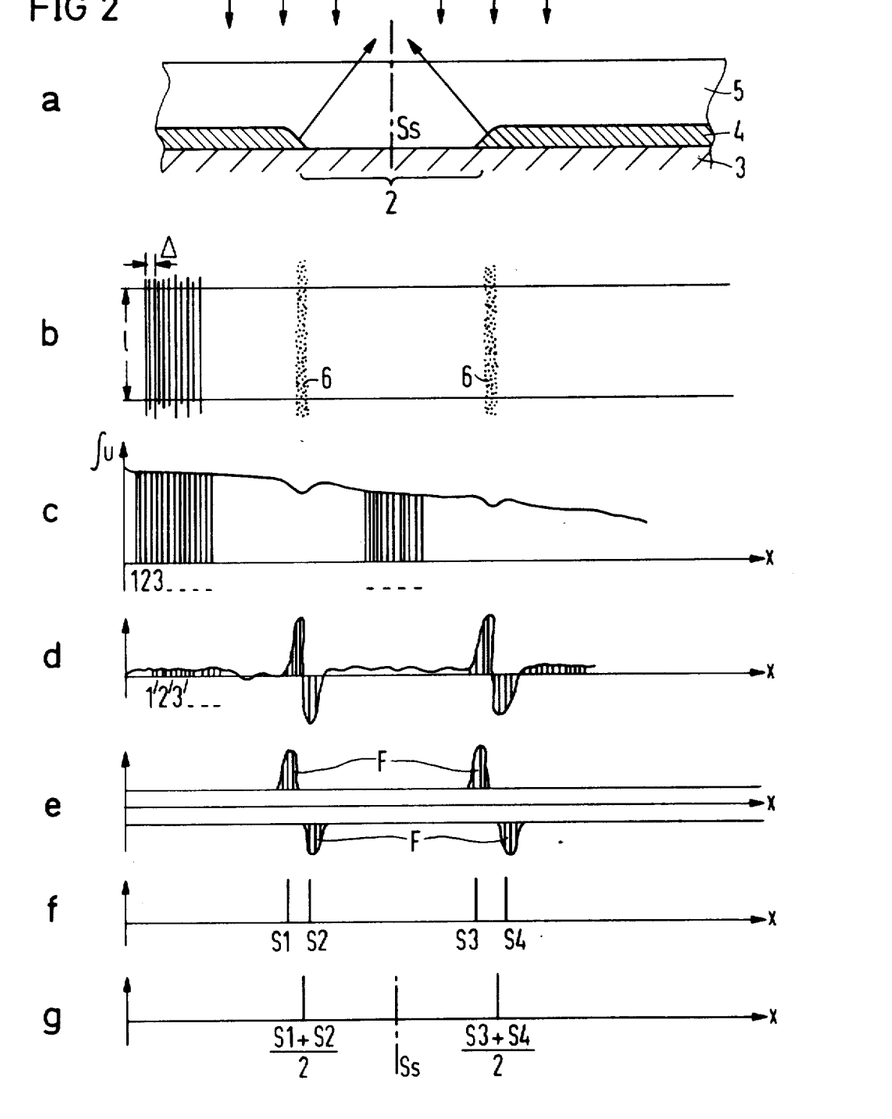
FIGS. 2a-2g illustrate the principle of detection of lines on a disc or, respectively, on a mask.
Figure 3:
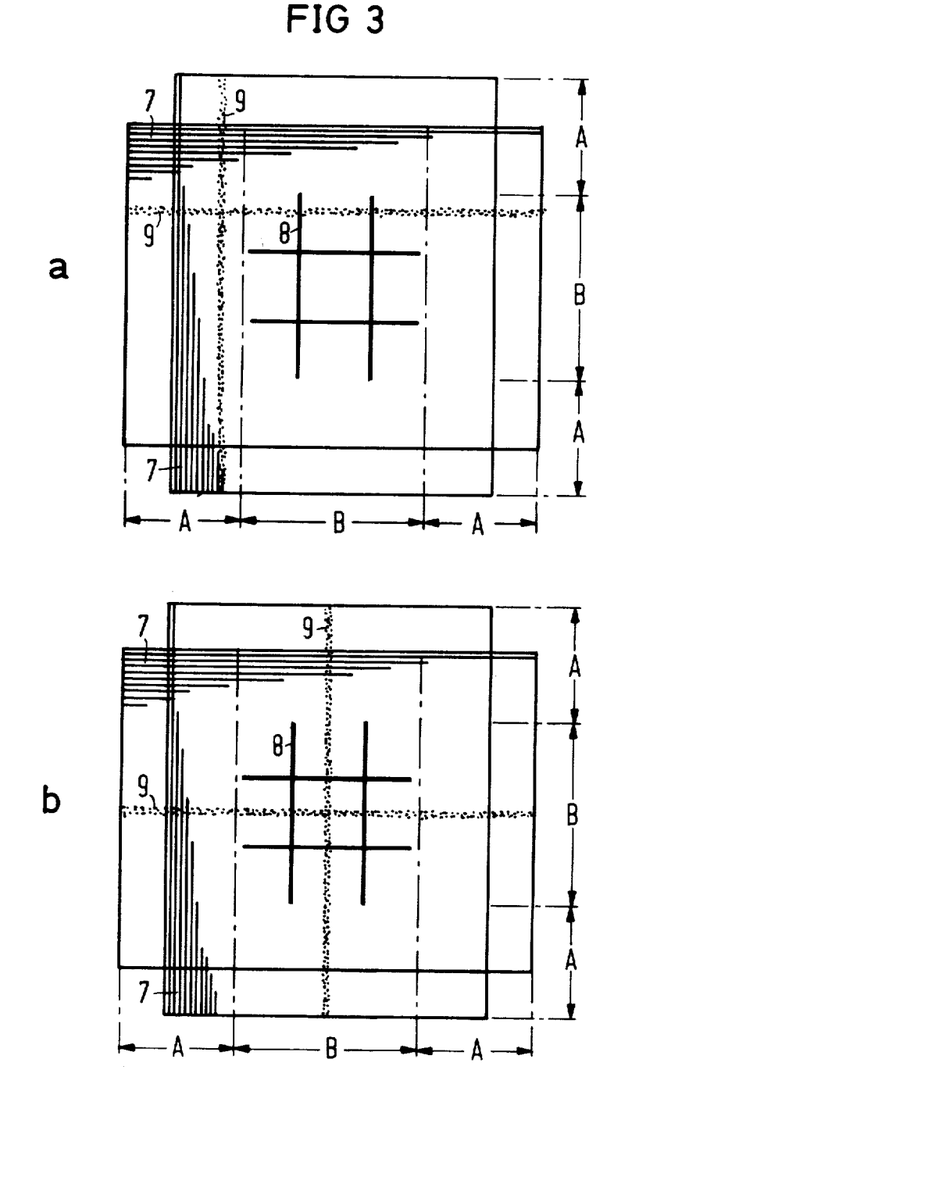
FIGS. 3a and 3b illustrate the arrangement of the adjustment structures on a mask and on a disk with various evaluation areas for rough and fine.

FIG. 3a and 3b illustrate a possible adjustment structure with corresponding evaluation areas for the case that the disk is moved to the mask in the adjusting process. FIG. 3a illustrate a screen 7 of two image sensors working line-wise whose scanning directions are arranged perpendicular to one another and in whose center an adjustment structure 8 is located on the mask. The adjustment structure on the mask represents a square or a square-like structure. The adjustment structure on the disk 9 is a cross which can comprise a plurality of lines. For a rough position recognition of this cross, a line-wise integration occurs in the marginal areas A of the screen and the position of the lines is determined according to FIG. 2. It is assured by means of this arrangement of the mask and the disk that only adjustment structures of the disk can be located within the integration areas A.

As the next step, the disk is moved into the center of the screen field between the two parallel adjustment marks of the mask, corresponding to the determined amount of deviation (FIG. 2b). For a fine adjustment, a line-wise integration in the area B of the screen field and an evaluation of the signal for the position determination of the adjustment structure on the mask and disk now occurs according to the process set forth in FIG. 2. The discrimination between structures on the mask and the disk is possible by means of their necessary positional sequence. Three areas are clearly definable in which only the mask or, respectively, the disk structures can be present. Since the contrast on the mask are generally very clear and constant, whereas these relationships on the disk are subject to great fluctuations, a differing amplification in the differential signal is advantageously undertaken in the three areas for mask signals and disk signals in order to obtain approximately equal amplitudes. This can occur automatically by means of an electronic determination of the maximum value of the differential signal in the disk area in conjunction with a subsequent follow-up of the amplification.

The positional deviations of the mask to the disk are determined for the fine adjustment from the position of the pitch lines on the disk and the mask determined according to FIG. 2 by means of corresponding further mean value formations and symmetrical observations.

For the position perpendicular thereto, either the image is rotated or a scanning direction generated orthogonally thereto, for example, by means of a second television camera, is employed. The sequence corresponds to that set forth above.

In principle, the following possibilities for the construction and the arrangement with respect to optics, mechanics and image sensors derives for the generation of the scanning grids lying perpendicular to one another and the two fields of vision required for the mask adjustment (FIG. 4). The two fields of vision 10 with the corresponding adjustment marks are located on the disk 3. These are imaged by way of a lens 11 onto two television cameras 12. The image rotation occurs in that the respective beam is divided and rotated by 90° by way of rotating prisms 13 and is then again reflected into the original beam direction. The fading-in and fading-out occurs electromechanically by way of shutters (not illustrated).

Figure 4A:
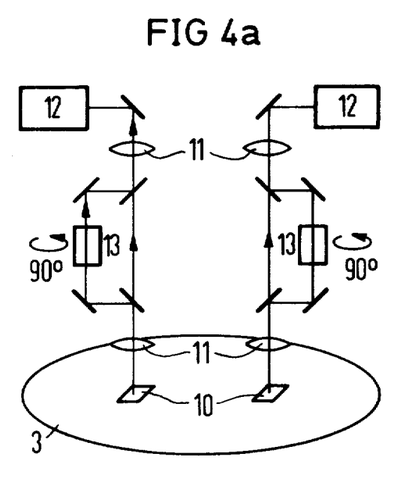
FIGS. 4a-4e illustrate constructional variations of the electro-optic scanning.
Figure 4B:
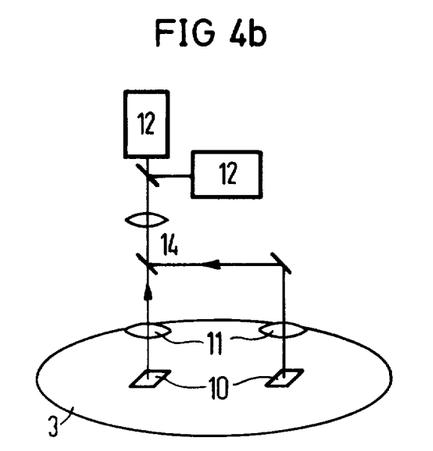

An optical image rotation is avoided in FIG. 4b in that the two optical channels of the two fields of vision are combined in one channel 14 and then again divided for two television cameras 12 whose scanning directions are arranged perpendicular to one another. The respective channels are likewise faded-in and faded-out electromechanically.

Figure 4C:
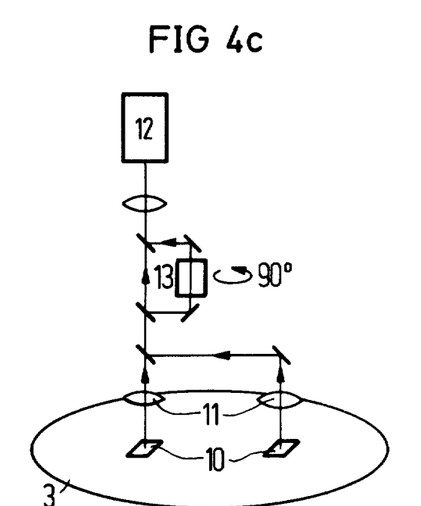
Figure 4D:
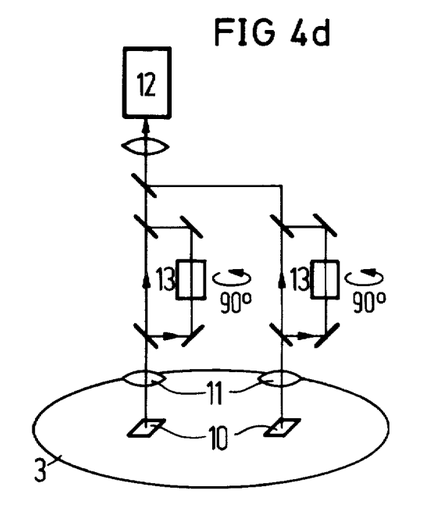

A single image sensor 14 (FIG. 4c) is also sufficient when one executes the image rotation optically and also combines the two channels optically. The image rotating installation can either occur in a setting input (FIG. 4c) or in front of the same for each individual channel (FIG. 4d).

Instead of a television camera, a corresponding semiconductor image camera can also be employed.

Figure 4E:
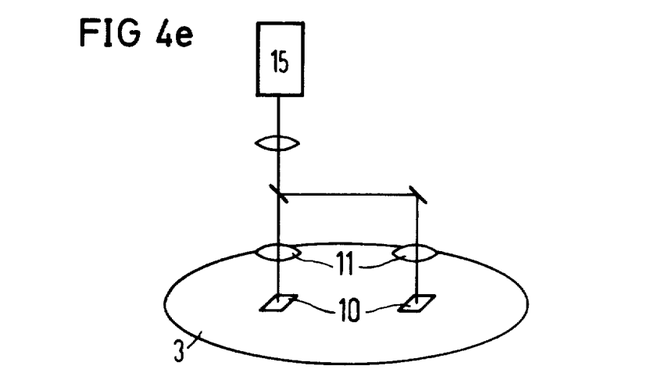

When an image sensor 15 is employed which has a freely selectable scanning direction, an arrangement according to FIG. 4e occurs, the optical image rotation being omitted and a single image sensor is sufficient.

Figures 5, 5A:
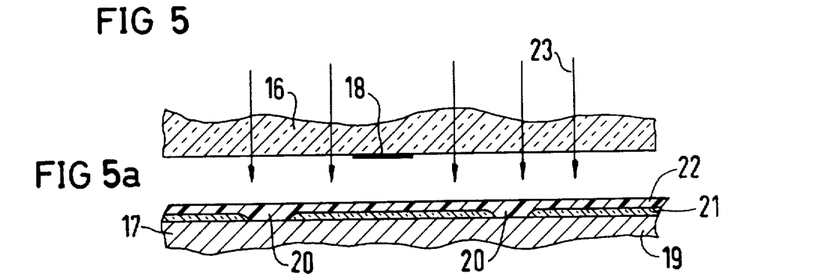
FIGS. 5a-5g illustrate the individual arrangement of disk line/mask line/disk line with the corresponding evalustions, in principle.

In FIG. 5a a mask 16 has a chromium line 18 on the side facing the disk 17. The disk 17 which can be arranged at a certain interval, comprises, for example, a silicon substrate 19, on which two lines 20 are located which can derive from recesses of a layer of silicon oxide 21. The structure coating of a photoresistor layer 22 is located over the silicon oxide layer 21. Given parallel vertical illumination 23, the lines on the disc appear as dark double lines because of the light reflected at the acclivity from the imaging lens.

Figure 5B:
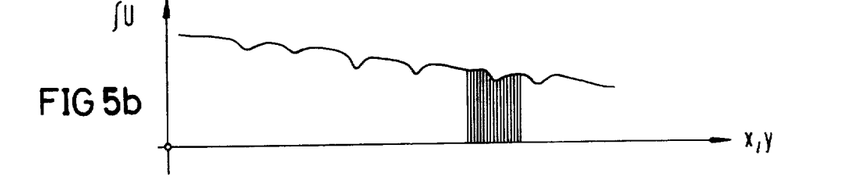

FIG. 5 illustrates the results of a line-wise integration over the location of the mask-disk arrangement, whereby the indentations in the continuous line are to be ascribed to the dark lines which are produced by the acclivities or, respectively, by the chromium line.

Figure 5C:
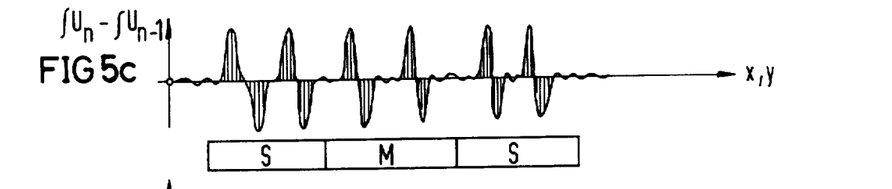
Figure 5D:
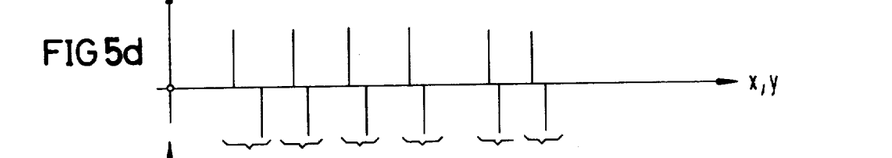
Figure 5E:
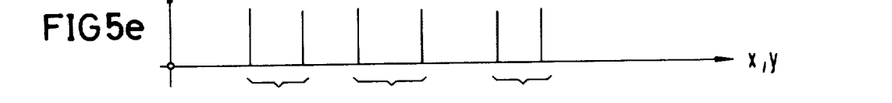
Figures 5F, 5G:
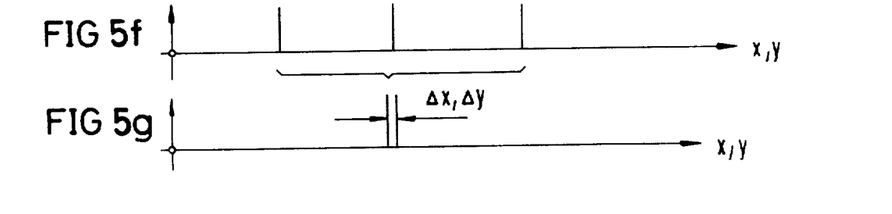

FIG. 5c illustrates the differential formation of the integration values of neighboring lines, as well as the clear assignment to the areas disk S, mask M and disk S. After a digitization of the amplitudes in the signal curve of FIG. 5c, the computation of the respective peak maximums or, respectively, centroids occurs. Position coordinates in the direction x or, respectively, y are derived therefrom (FIG. 5d). These are now further combined, as illustrated in FIG. 5e, and, after a symmetry observation (FIG. 5f), the final result $\Delta x$ or, respectively, $\Delta y$ is determined (FIG. 5g).

Figure 6:
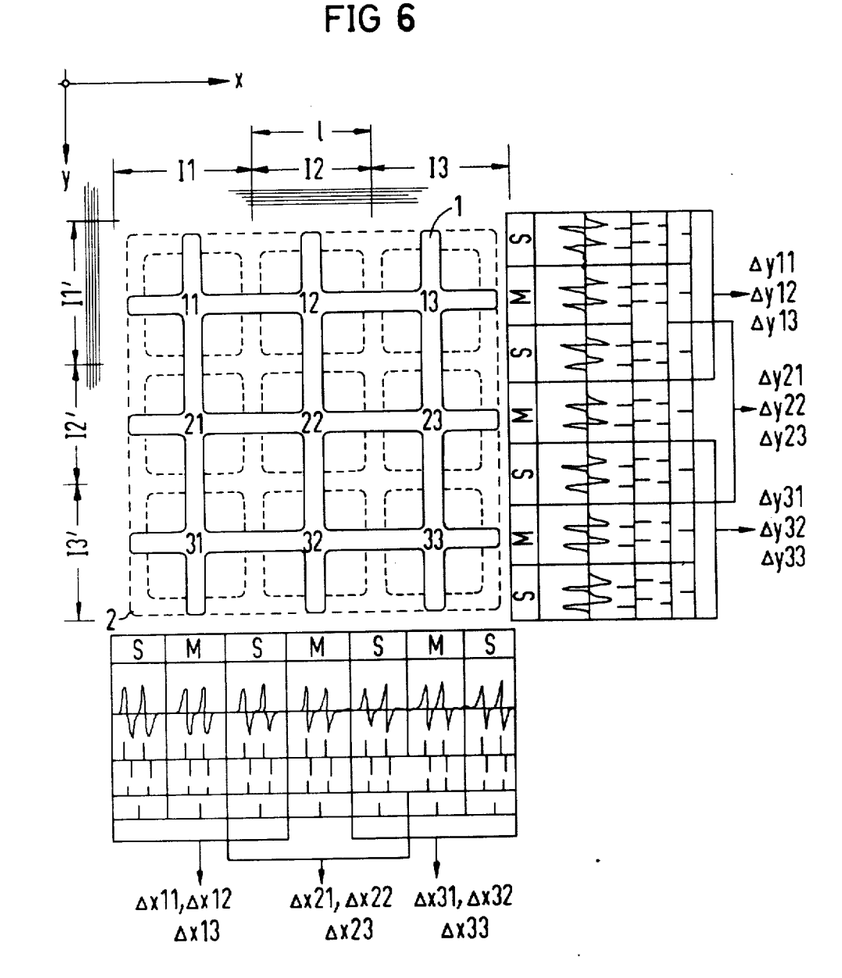
FIG. 6 illustrates a multiple arrangement in the form of a two-dimensional lattice.

FIG. 6 illustrates a multiple arrangement in the form of a two-dimensional lattice with the corresponding parallel integration areas, as well as the evaluation for the various individual arrangements. In FIG. 6, the width of an integration area 1 and the individual integration areas I1–I3 or, respectively, I1'–I3' are shown. The symbols $\Delta y11 \ldots \Delta y33$ characterize the individual results in the y-direction and the symbols $\Delta x11 \ldots \Delta x33$ characterize the results in the x-direction.

According to the invention, an integration curves in three columns in the x-direction and in the y-direction corresponding to the number of lattice elements. Thereby, nine lattice elements with respectively nine value pairs $\Delta x_m$, $\Delta y_m$ occur. The mean value derived herefrom then supplies the final positional displacement $\Delta x$ and $\Delta y$.

Figure 7:
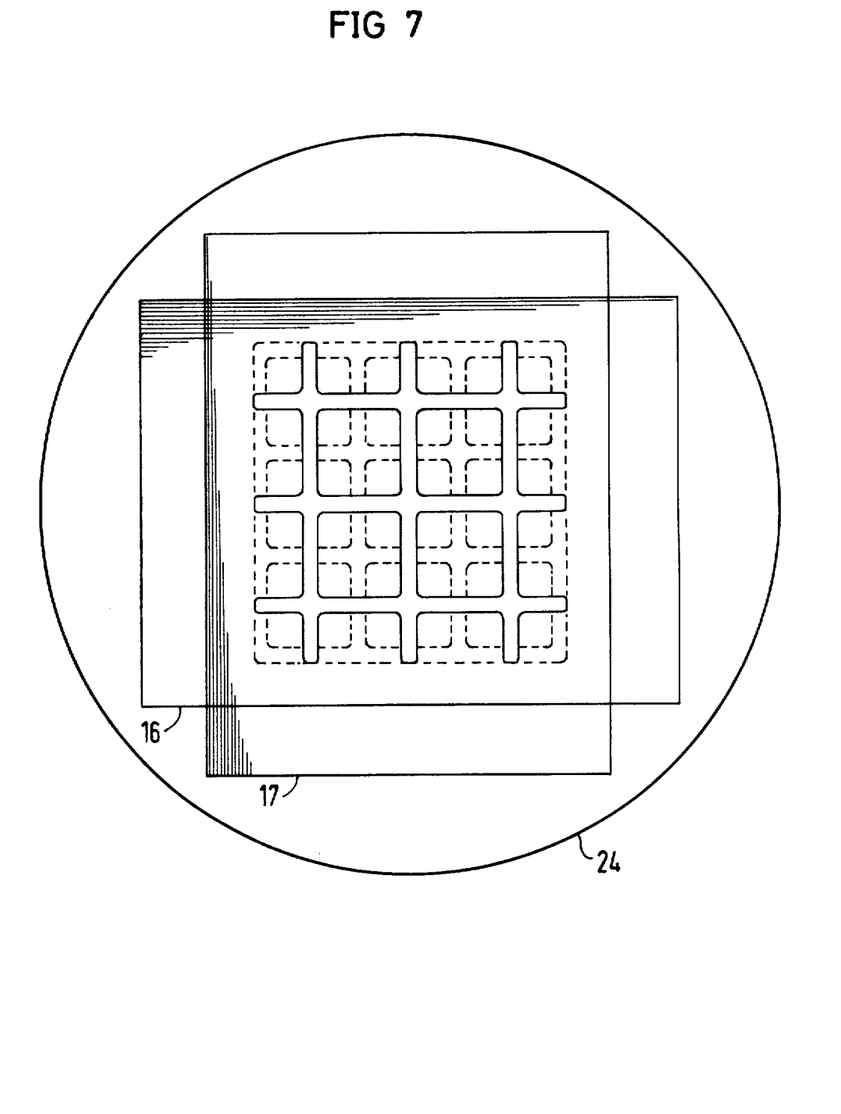
FIG. 7 illustrates a two-dimensional lattice on the mask and on a disk centrally located in a field of vision.

FIG. 7 illustrates the two-dimensional lattice on a mask 16 and a disk 17 centrally located in a field of vision 24 of the imaging optics, as well as two scanning fields of two electronic image sensors, for example TV cameras, which fields are orthogonally arranged and organized line-wise for the realization of the parallel and orthogonal integration areas.

Figure 8:
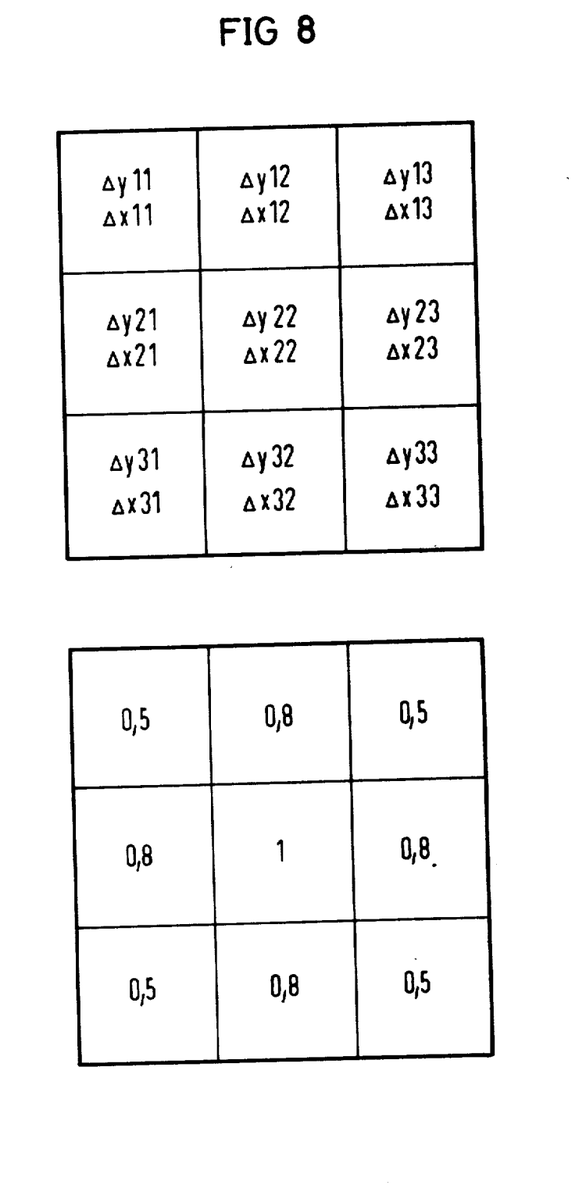
FIG. 8 illustrates a matrix field of the individual results and, likewise, a matrix field with possible waiting factors.

In the illustration of FIG. 8, the interval from the optical axis of the individual arrangement has been employed as an individual criterion. In the mean value formation, in particular, a weighting of the results of the values $\Delta x_m$, $\Delta y_n$ from the individual lattice elements can occur for increasing the total precision in such a manner that the results from the elements which lie at a greater distance from the optical axis are weighted lower. By means of the displacement of the lattices on the mask and the disk into one another and as a result of the evaluation for the values $\Delta x_m$, $\Delta y_n$ at first referring to the individual lattice elements, the precision with which the individual line is comprehended is only to be referred to the small area of a lattice element. The attainable total precision derives from the precision of the individual lines, in conjunction with the number of lines per lattice element and the plurality of lattice elements, according to the laws of statistics.

FIG. 9 again illustrates the two-dimensional lattice with the integration areas I or, respectively, I', as well as an arrangement of parallel processors $\mu p1-\mu p3$ or, respectively $\mu p1'-\mu p3'$, as well as the processes $\mu p4'$ and $\mu p4$ for the combination or, respectively, mean value formation of the individual results in the x-direction and the y-direction.

For realizing the evaluation processes illustrated in FIG. 6, in a mask structure, the employment of parallel processors $\mu p$ is available for the calculation of the $\Delta x_m$, $\Delta y_n$ in the individual elements, to which an analog portion for the line-wise integration and a differential formation is respectively assigned. Further microprocessors receive the mean value formation of the results from the individual lattice elements.

Figure 1:
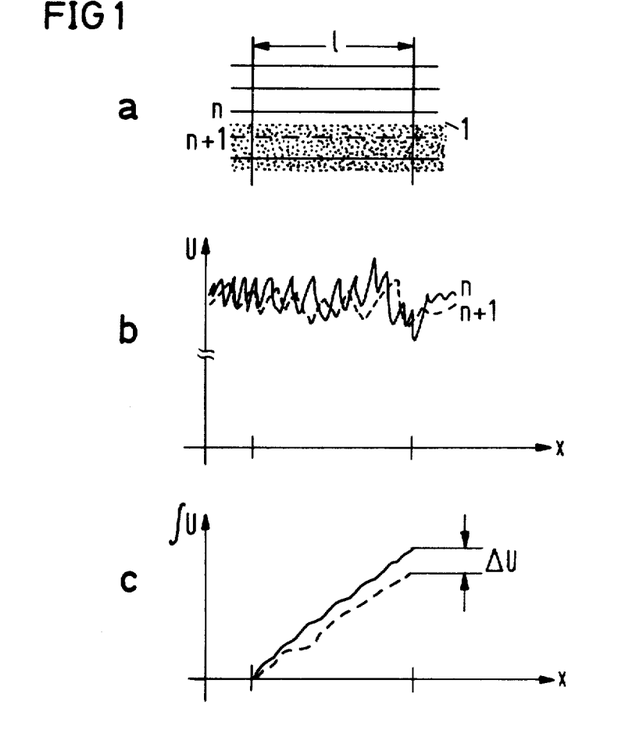
FIGS. 1a-1c illustrate the principle of recognition of low contrast edges.
Figure 9:
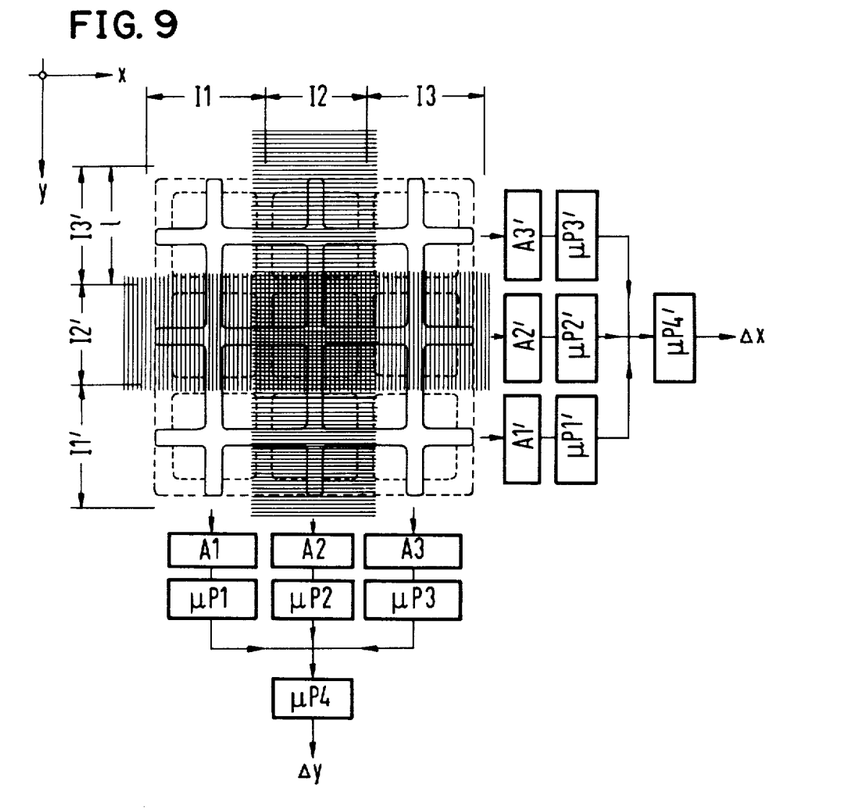
FIG. 9 illustrates a two-dimensional lattice again, with the integration areas as well as an arrangement of parallel processes.

In order to achieve an adjustment time which is as short as possible, FIG. 9 illustrates a possible parallel image processing of the two-dimensional lattice. The analog evaluation devices (A1–A3 or, respectively, A1'–A3') is respectively provided for each column in the x-direction and the y-direction, by means of which the integration and the difference formation is undertaken. A microprocessor ($\mu p1-\mu p3$ or, respectively, $\mu p1'-\mu p3'$) is again respectively provided for each column in the x-direction and the y-direction for the further digital processing (centroid formation, mean value formation, combination and symmetry observation) according to FIG. 1. The combination of the individual results for the individual arrangements in the x-direction and the y-direction is carried out by means of the processors $\mu p4$ or, respectively, $\mu p4'$.

The arrows in the direction $\Delta x$ and $\Delta y$ indicate the output of the result of the position recognition to the adjustment elements.

In the rapid parallel information processing which exists here, a multiple repetition of the measuring scan and a mean value formation from the individual result ($\Delta x$, $\Delta y$) is available for increasing precision.

Figure 10:
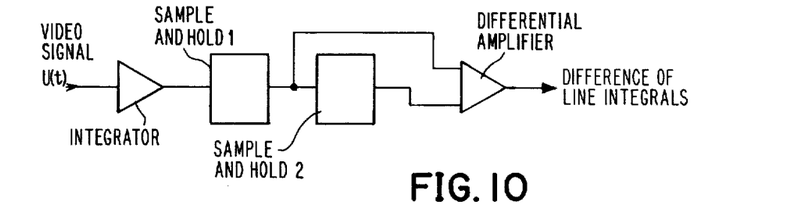
FIG. 10 is an exemplary embodiment of the circuit for practicing the invention and providing the difference of line integrals from an input video signal U(t).

Referring to FIG. 10, an exemplary embodiment is illustrated for a circuit by which the difference of the line integrals is provided from a video input signal U (t). The input signal U (t) is supplied to an integrator to provide an integration of the line-scanned signals. The integrator feeds a first sample and hold circuit 1 which, in turn, feeds one input of a differential amplifier and a second sample and hold circuit 2 which feeds the other input of the differential amplifier. Therefore, each line scan is sampled and input to the differential amplifier along with a sampled input of the previous line scanned. Therefore, the differential amplifier operates on the sampled integrals of successive lines.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A process for automatically aligning a first structure carried on a mask with a second structure carried on a disk, comprising the steps of:

illuminating the mask and the disk;

optically scanning the mask and the disk on a line-by-line basis in the x-direction to detect structure lines which are orthogonal to one another and contemporaneously generating brightness signals for each line scan;

storing the brightness signals;

forming the difference between the brightness signals of successive line scans;

forming brightness centroids in response to the difference signals representing brightness changes;

forming a mean value from the centroids and assigning the same to a centerline of a structure line; and     repeating the above steps in the y-direction.

2. The process of claim 1, comprising the steps of:

integrating the brightness signals of each scan line in the x-direction to provide rough adjustment signals for structure lines;

moving one of the structures relative the other in the x-direction in accordance with the rough adjustment signals to place the structure lines in close proximity; and integrating the brightness signals of each scan line in the x-direction to obtain fine adjustment signals.

3. The process of claim 2, comprising the steps of: integrating, moving and integrating in the y-direction.

4. The process of claim 3, comprising the step of: providing structure adjustment lines on the mask and disk such that at least one structure adjustment line on one of the mask or disk lies between two structure adjustment lines on the other of the mask or disk for an observation of symmetry.

5. The process of claim 1, comprising the step of: imaging an area of the mask and of the disk with an optics onto a line scanning image sensor.

6. The process of claim 5, wherein the step of imaging is further defined as:
imaging the areas onto a pair of image sensors which have scanning directions which are orthogonal to one another.

7. The process of claim 6, wherein the step of imaging is further defined as:
imaging onto a pair of television cameras.

8. The process of claim 6, wherein the step of imaging is further defined as:
imaging onto a pair of solid state image sensors.

9. The process of claim 6, wherein the step of imaging is further defined as:
imaging the areas onto a pair of image sensors which have freely-selectable and scanning directions.

10. The process of claim 6, wherein the step of imaging is further defined as:
imaging the areas onto a single image sensor and rotating one of the images.

11. The process of claim 5, comprising the step of:
providing a plurality of structure adjustment lines in the form of a cross on the disk; and
providing a plurality of structure adjustment lines on the mask in the form of quadratic line structure.

12. Apparatus for automatically aligning a first structure carried on a mask with a second structure carried on a disk, the mask and disk being illuminated, comprising:
scanning means for optically line scanning the mask and the disk, including brightness signal generating means for generating brightness signals for each line scan;
storage means connected to said brightness signal generating means for storing the brightness signals;
difference forming means connected to said storage means and operable to form difference signals from the brightness signals of successive line scans;
centroid forming means connected to said difference forming means and operable to produce centroid signals representing brightness changes;
mean value means connected to said centroid forming means and operable to form mean values from said centroid signals and assign each mean value to a respective centerline of a structure line.

13. The apparatus of claim 12, wherein said scanning means comprises:
at least one line scanning image sensor; and
imaging means for imaging areas of the mask and disk, which bear the first and second structures, for providing line scanning in the x-direction and in the y-direction.

15. The apparatus of claim 12, wherein said scanning means includes:
first and second image sensors with respective first and second fields of vision on one of said structures;
a first optical means imaging said first field of vision onto said first image sensor; and
a second optical means imaging said second field of vision onto said second image sensor,
each of said optical means including a primary beam path and a rotated beam path shunting a portion of said primary beam path.

16. The apparatus of claim 15, wherein each of said image sensors comprises a television camera.

17. The apparatus of claim 12, wherein said scanning means includes:
first and second image sensors with respective first and second fields of vision on one of said structures and scanning directions which are perpendicular to each other;
a first optical means imaging said first field of vision onto said first image sensor; and
a second optical means imaging said second field of vision onto said second image sensor,
said first and second optical means including a common portion for combining and then splitting the respective beams.

18. The apparatus of claim 17, wherein each of said image sensors comprises a television camera.

19. The apparatus of claim 12, wherein said scanning means includes:
an image sensor with first and second fields of vision on one of said structures;
a first optical means imaging said first field of vision onto said image sensor; and
a second optical means imaging said second field of vision onto said image sensor,
said first and second optical means including a common portion combining and splitting the respective beams including a bypass portion for splitting, rotating and recombining the combined beam.

20. The apparatus of claim 19, wherein said image sensor comprises a television camera.

21. The apparatus of claim 12, wherein said scanning means includes:
a sensor with first and second fields of vision on one of said structures;
a first optical means imaging said first field of vision onto said image sensor; and
a second optical means imaging said second field of vision onto said image sensor;
each of said optical means including a primary beam path and a rotated beam path shunting a portion of said primary beam path, and
each of said optical means including a portion in common with each other for combining the primary and rotated beams of each path.

22. The apparatus of claim 21, wherein said image sensor comprises a television camera.

23. The apparatus of claim 12, wherein said scanning means includes:
a semiconductor image sensor having orthogonal scanning directions with respective first and second fields of vision on one of said structures;

a first optical means imaging said first field of vision onto said first television camera; and a second optical means imaging said second field of vision onto said second television camera.

24. In combination with the apparatus of claim 12;

a plurality of lines in the form of a cross on the disk as said first structure, said lines being of predetermined length; and a quadratic line structure as the second structure on the mask.

25. The apparatus of claim 12, comprising:

analog integration means for forming analog integral values of the brightness signals;

analog means in said difference forming means for forming difference analog values from the integrated signals; and an analog/digital converter for converting the analog difference signals to digital difference signals.

26. The apparatus of claim 25, comprising:

digital storage means for storing the digital difference signals;

said centroid forming means including means for digitally combining the digital difference signals to provide digital mean value signals, means for monitoring the number, distribution and form of the centroids and providing corresponding signals, and means for outputting said signals as adjustment signals; and positioning means for positioning the disk in response to the signals output by said signal output means.

27. A process for automatically aligning a first adjustment line structure on a mask with a second adjustment line structure on a disk, comprising the steps of:

positioning the mask and the disc such that at least one of the adjustment lines of one of the adjustment structures lies between a pair of adjustment lines of the other adjustment structure;

illuminating the mask and disc;

optoelectronically scanning the adjustment structures line-by-line and generating brigtness signals for each line scan;

integrating the brightness signals;

subtracting each integrated signal from each preceding integrated signal to obtain rough adjustment difference signals representing the positions of the one adjustment line and the pair of adjustment lines;

forming the mean values of the rough adjustment signals and providing first position signals indicating the positions of the peaks of the difference signals;

combining each pair of adjacent position signals symmetrically with respect to the distance therebetween to provide second position signals which represent the edges of the one adjustment line and the pair of adjustment lines;

symmetrically combining pairs of adjacent second position signals to provide third position signals representing the centerlines of the one and the pair of adjustment lines; and comparing the distances between each line of the pair of lines and the one line to obtain a fine adjustment signal.

28. The process of claim 27, wherein the fine adjustment signal is obtained for one coordinate adjustment direction and the recited steps are repeated for the other coordinate direction.

29. The process of claim 27, comprising the step of:

weighting the mean value signals with greater weighting for the center of an adjustment structure which lies closer to the optical axis and a lesser weighting applied to areas which lie away from the optical axis.

30. Apparatus for adjusting and aligning a first two-dimensional quadratic lattice carried on a disk with a second two-dimensional quadratic lattice carried on a mask such that lines of the second lattice lie between adjacent lines of the first lattice, comprising:

means for illuminating the first and second lattice structures; and in each of two co-ordinate directions means for optoelectronically line-scanning the lattice structures and providing brightness signals for each line scan;

means for integrating the brightness signals;

subtracting means for subtracting each integrated signal from each preceding integrated signal to obtain difference signals representing, as a rough measurement, the positions of the lattice lines;

means for providing first position signals at the peaks of the difference signals;

first means for symmetrically combining pairs of adjacent first position signals with respect to the distance between each pair to provide second position signals representing the edges of the lattice lines;

second means for symmetrically combining pairs of adjacent second position signals with respect to the distance between each pair to provide third position signals representing the centerlines of the respective lattice lines; and means for comparing the distance between adjacent third position signals and providing fine adjustment signals representing the difference between the position of a lattice line and the adjacent lattice line on each side thereof.

31. The apparatus of claim 30, wherein said means for optoelectronically scanning the lattice structures comprises a pair of image sensors.

32. The apparatus of claim 30, wherein said means for optoelectronically scanning the lattice structures comprises a pair of television cameras.

14. The process of claim 1, comprising the step of:

monitoring the number of centroids;

monitoring the form of the centroids; and monitoring the distribution of the centroids.

* * * * *